United States Patent
Hu et al.

(10) Patent No.: US 7,400,659 B2
(45) Date of Patent: Jul. 15, 2008

(54) METHOD AND DEVICE FOR PERFORMING DBR LASER WAVELENGTH MODULATION FREE OF THERMAL EFFECT

(75) Inventors: Martin H Hu, Painted Post, NY (US); Nobuhiko Nishiyama, Painted Post, NY (US); Chung-En Zah, Holmdel, NY (US)

(73) Assignee: Corning Incorporated, Corning, NY (US)

( * ) Notice: Subject to any disclaimer, the term of this patent is extended or adjusted under 35 U.S.C. 154(b) by 97 days.

(21) Appl. No.: 11/297,897

(22) Filed: Dec. 8, 2005

(65) Prior Publication Data

US 2007/0133629 A1    Jun. 14, 2007

(51) Int. Cl.
*H01S 3/13* (2006.01)

(52) U.S. Cl. .............................. 372/32; 372/22; 372/26; 372/50.11; 372/34; 372/29.014

(58) Field of Classification Search .................... 372/26, 372/50.11, 34, 22, 32
See application file for complete search history.

(56) References Cited

U.S. PATENT DOCUMENTS

| 6,389,046 | B1 * | 5/2002 | Stayt et al. | ............... 372/29.02 |
|---|---|---|---|---|
| 6,738,398 | B2 | 5/2004 | Hirata et al. | ................... 372/32 |
| 6,885,684 | B2 * | 4/2005 | Ichino | ...................... 372/38.01 |
| 2001/0005388 | A1 * | 6/2001 | Hirata et al. | .................. 372/22 |
| 2004/0264525 | A1 | 12/2004 | Senga et al. | ............... 372/38.1 |
| 2006/0120416 | A1 | 6/2006 | Hu et al. | ....................... 372/26 |

FOREIGN PATENT DOCUMENTS

WO    WO2005/091450    9/2005

* cited by examiner

*Primary Examiner*—Minsun Harvey
*Assistant Examiner*—Patrick Stafford
(74) *Attorney, Agent, or Firm*—Svethana Z. Short

(57) ABSTRACT

The present invention is directed to a method and system for providing a three-level current scheme to a semiconductor laser to control beam wavelength and laser temperature. A first current is received into a gain section of the semiconductor laser and at least one other current is received into a DBR and/or phase section of the semiconductor laser. This other current(s) is pulse-width modulated based upon a required temperature value. An output beam is generated by the semiconductor laser based upon the received first current and the received pulse-width modulated current(s).

20 Claims, 6 Drawing Sheets

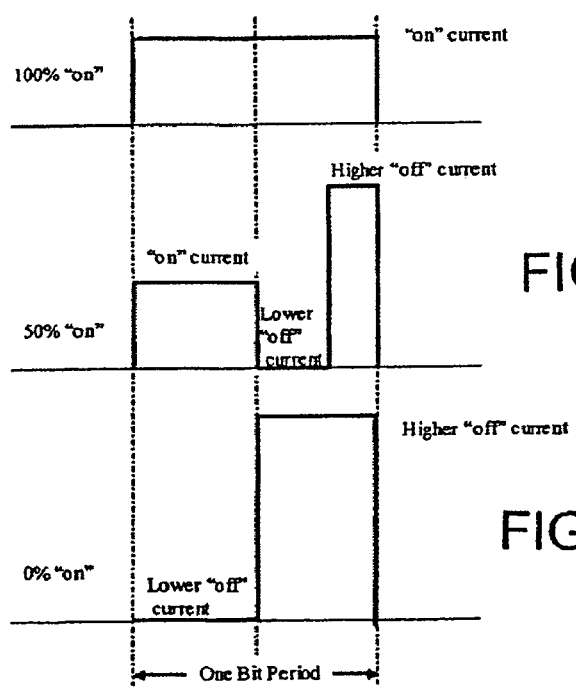
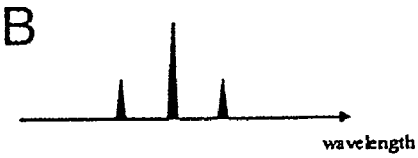
FIG. 4A
FIG. 4B
FIG. 4C

FIG. 5A
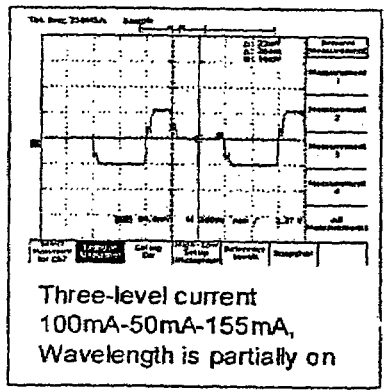
Three-level current 100mA-50mA-155mA, Wavelength is partially on
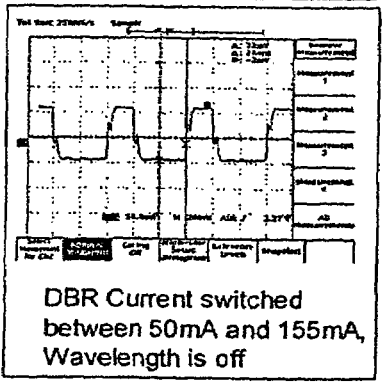
DBR Current switched between 50mA and 155mA, Wavelength is off
FIG. 5B
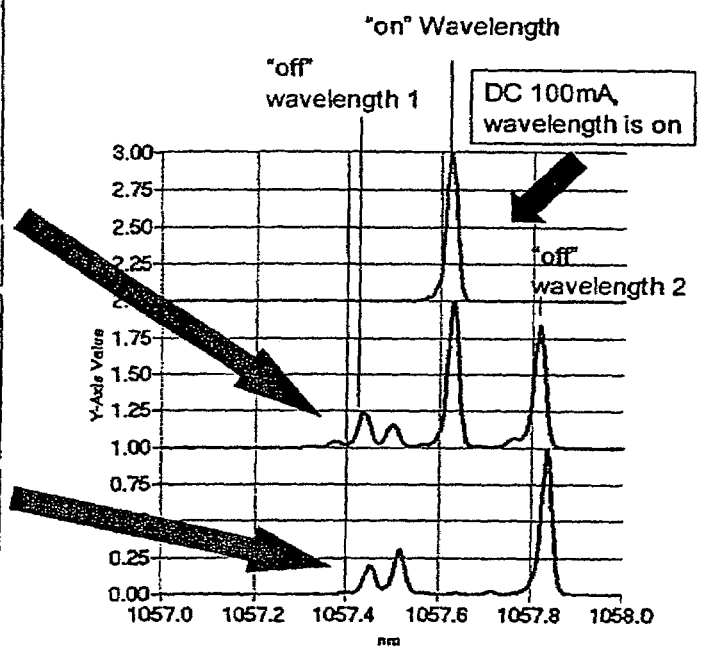
FIG. 5C

US 7,400,659 B2

METHOD AND DEVICE FOR PERFORMING DBR LASER WAVELENGTH MODULATION FREE OF THERMAL EFFECT

BACKGROUND OF THE INVENTION

1. Field of the Invention

The present invention relates generally to a method and device to perform wavelength modulation and more specifically to a method and system for controlling current injection into a Distributed Bragg Reflector (DBR) semiconductor laser to perform wavelength modulation.

2. Background

Lasers have been employed in display technologies for years. In displays such as computer displays, televisions, or the like, colors are generated by the superposition of three primary colors: red, blue and green. As such, within laser-based displays, lasers are employed to provide the primary colors. Each laser can be raster-scanned across the screen or can be stationary and employed to illuminate an image, e.g., a motion picture film or spatial light modulator containing an image. The ability of a laser to provide a beam having excellent brightness characteristics leads to efficient and well-performing lasers within laser-based projectors, when compared to the brightness characteristics of incandescent bulbs used in conventional motion picture theaters.

Laser-based projectors may use single- or multi-wavelength lasers. Single-wavelength semiconductor lasers, such as distributed-Bragg-reflector (DBR) lasers are potential sources for wavelength conversion using a non-linear optical effect. For example, a 1060 nm DBR semiconductor laser tuned to the spectral center of a second-harmonics-generation (SHG) device such as a non-linear crystal may be used to convert the wavelength output by the DBR semiconductor laser to a 530 nm beam. This provides a low-cost, compact and efficient non-linear source of green light.

FIG. 1 schematically illustrates a conventional DBR semiconductor laser 100 and a second harmonic generation (SHG) device 150. The DBR semiconductor laser 100 includes a DBR section or section 110, a phase section or section 120 and a gain section or section 130. The gain section 130, when injected with a continuous wave (CW) current, generates continuous optical power for the laser. The current injected into the DBR section 110 makes large changes to wavelengths output from the laser and the current into the phase section 120 makes small changes to the wavelength of the beam output of the laser. The SHG device 150 receives the beam produced by the semiconductor laser 100. The output intensity of the converted wavelength (green, for example) depends upon alignment of the DBR laser wavelength and the SHG device's spectral center. The beam output from the SHG device 150 is then directed to an output such as display screen.

Generally, for technologies involving video displays, the optical power such as that used to generate the intensity of green light, for example, needs to be modulated at a fundamental frequency of 10 to 100 MHz and with an extinction ratio of approximately 40 dB. The extinction ratio is the ratio of high optical power level to low optical power level. To achieve this combination of high modulation speed and larger extinction ratio remains a daunting task.

One way to obtain a DBR laser 100 and SHG 150 based light source having a fast modulation and a large extinction-ratio is to rapidly modulate the output wavelength of a DBR semiconductor laser 100. As a result, the DBR semiconductor laser beam rapidly scans cross the narrow spectral width of a non-linear SHG device 150 (for example a nonlinear crystal) to produce the necessary intensity modulation. For example, if maximum green power is needed, the DBR wavelength is tuned to the spectral center of the non-linear crystal and, if zero green power is needed a specific time later, the DBR wavelength is tuned outside the spectral width of the non-linear crystal to produce a dark image.

One modulation scheme for use in video is pulse-width wavelength modulation. In this case, the current into the gain section 130 of the DBR laser 100 is maintained at a constant value so that the output intensity of the DBR laser 100 is kept nearly constant, while the current into the DBR section 110 has two possible values: one corresponding to the "on" wavelength that matches to the SHG center wavelength and the other corresponding to the "off" wavelength that is shorter or longer than the SHG center wavelength. The strength or brightness of the green light in each bit period or pixel for the human eyes is determined by the duration in time of current into DBR section 110 corresponding to the "on" wavelength due to the slow response of human eye sensitivity, therefore, the eyes just feel average brightness. Therefore, to modulate the brightness of the green light in each period, the duration (or pulse-width) of current into DBR section 110 corresponding to the "on" wavelength is modulated. This is called "pulse-width modulation"

For a DBR laser 100, the carrier plasma effect is used to dynamically shift the wavelength by injecting current into the DBR section 110. Increasing the current into the DBR section 110 shifts the lasing wavelength to the shorter wavelength end. This is called blue shifting. Reducing the current into the DBR section 110 shifts the laser wavelength to the longer wavelength end. This is called red shifting.

However, the carrier plasma effect described above ignores the possible adverse thermal effect that the injection of current into the laser causes. Injecting current into the DBR section 110 also causes a temperature change in the DBR section 110. For example, if the current corresponding to the "off" wavelength is larger than the current corresponding to the "on" wavelength, then long "off" bits will cause the DBR section temperature to rise, resulting in the lasing wavelength moving toward longer wavelengths, diminishing or completely reversing the required wavelength blue shifting. Alternately, if the current corresponding to the "off" wavelength is smaller than the current corresponding to the "on" wavelength, then long "off" bits will cause the DBR section temperature to fall, resulting in the lasing wavelength moving toward shorter wavelengths, diminishing or completely reversing the required wavelength red shifting. In both instances, at the "on" current that follows, the lasing wavelength is away from the SHG center wavelength, resulting in an undesirable low conversion efficiency.

In a video display application, the DBR section 110 temperature at a specific time depends on the history of previous bits. The heating caused by current injection of the "on" wavelength and "off" wavelength during previous bits affects the wavelength of the current bit. Therefore, at any particular time, the thermal effect can cause the laser wavelength to drift away from the center wavelength of an SHG 150 even if the "on" wavelength is applied, reducing the conversion efficiency of the SHG 150. FIG. 2 shows this effect, known as a thermally-induced patterning effect. In FIG. 2, the temperature of the DBR section 110 increases when a constant "on" current is applied, resulting in a longer actual wavelength and less intense SHG output over time. Likewise, the temperature of the DBR section 110 decreases when a lower constant "off" current is applied, resulting in a shorter actual wavelength over time.

SUMMARY OF THE INVENTION

Accordingly, what is needed is a device that minimizes the thermal effect associated with the injection of current into the DBR section of a DBR semiconductor laser while providing proper wavelength modulation.

Thus in accordance with an exemplary embodiment of the present invention, a method for providing a three-level pulse-width modulated current to a semiconductor laser is disclosed. A first current is received into a gain section of the semiconductor laser and a second current is received into a DBR section of the semiconductor laser and a third current is received into a phase section of the semiconductor laser. The second and third currents are modulated between three values based upon a required temperature value. An output beam is generated by the semiconductor laser based upon the received first, second and third currents.

In accordance with another exemplary embodiment of the present invention a system for providing a three-level pulse-width modulated current to a semiconductor laser to control wavelength modulation of a beam generated by the laser. A controller obtains a required intensity value and current sources inject a first current into a gain section of the semiconductor laser and a second current into a DBR section of the semiconductor laser. The second current is pulse-width modulated between three values based upon the required intensity value and a required temperature value, and the laser generates an output beam. A third current may also be injected into a phase section of the semiconductor laser. The third current is pulse-width modulated between three values based upon the required intensity value and a required temperature value.

Additional features and advantages of the invention will be set forth in the detailed description which follows, and in part will be readily apparent to those skilled in the art from the description or recognized by practicing the invention as described in the written description and claims hereof, as well as the appended drawings.

It is to be understood that both the foregoing general description and the following detailed description are merely exemplary of the invention, and are intended to provide an overview or framework to understanding the nature and character of the invention as it is claimed. The accompanying drawings are included to provide a further understanding of the invention, and are incorporated in and constitute a part of this specification. The drawings illustrate one or more embodiment(s) of the invention, and together with the description serve to explain the principles and operation of the invention.

BRIEF DESCRIPTION OF THE DRAWINGS

The above and other aspects, features and advantages of this invention will be described in relation to the following figures in which like reference characters refer to the same parts throughout the different views:

FIGS. 4A, 4B and 4C illustrate current and wavelength characteristics associated with the three-level current scheme of the present invention;

FIGS. 5A, 5B and 5C illustrate test results showing current and wavelength characteristics associated with the three-level current scheme of the present invention.

DETAILED DESCRIPTION

An exemplary embodiment of the present invention relates to a method and associated system to enable efficient operation of a DBR semiconductor laser and to reduce the thermal effects associated with semiconductor lasers. Although specific embodiments will be illustrated and described herein with regard to controlling the currents injected into a DBR semiconductor laser in order to reduce the thermally induced wavelength shift, it should be appreciated by those of ordinary skill in the art that such a system and method would also be advantageous, for example, in applications for any semiconductor laser device in which current injection can cause adverse thermal effects.

Additionally, while the DBR semiconductor laser of the present invention is employed within an application directed to video signal processing and display, this disclosure is intended to cover any adaptations or variations of the present invention that generally relate to semiconductor lasers. For example, this invention can also be employed in such areas as optical data storage, image reproduction, optical communications as well as sensing instruments and the like.

In the following detailed description of the exemplary embodiments, reference is made to the accompanying drawings that form part hereof, and in which is shown by way of illustration, specific exemplary embodiments in which the invention may be practiced. These embodiments are described in sufficient detail to enable those skilled in the art to practice the invention, and it is to be understood that other embodiments may be utilized and that logical, mechanical and/or electrical changes may be made without departing from the spirit and scope of the present invention. The following detail description is therefore not to be taken in a limiting sense.

Figure 1:
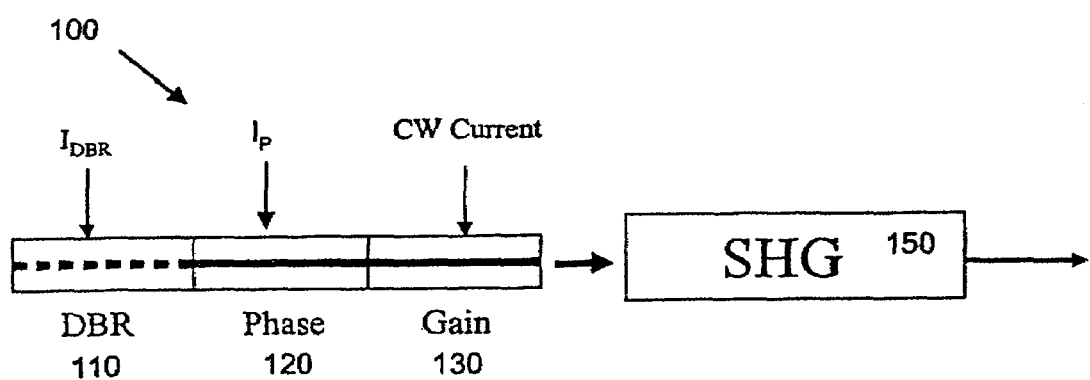
FIG. 1 is schematic diagram of a conventional 3-section DBR semiconductor laser and an SHG device.
Figure 2:
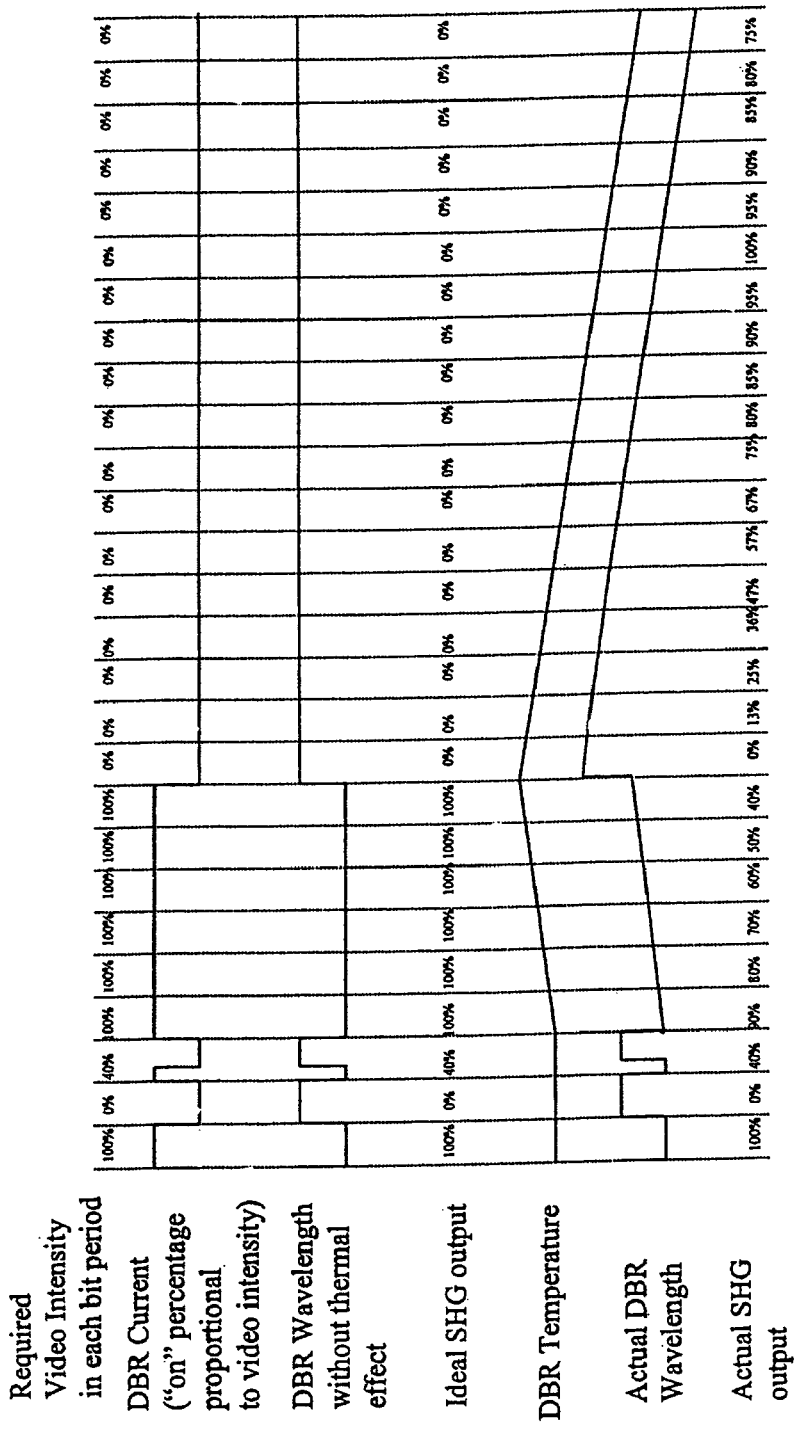
FIG. 2 illustrates a thermally-induced patterning effect and the accompanying wavelength shift as a function of DBR pulse width of a DBR semiconductor laser.
Figure 3:
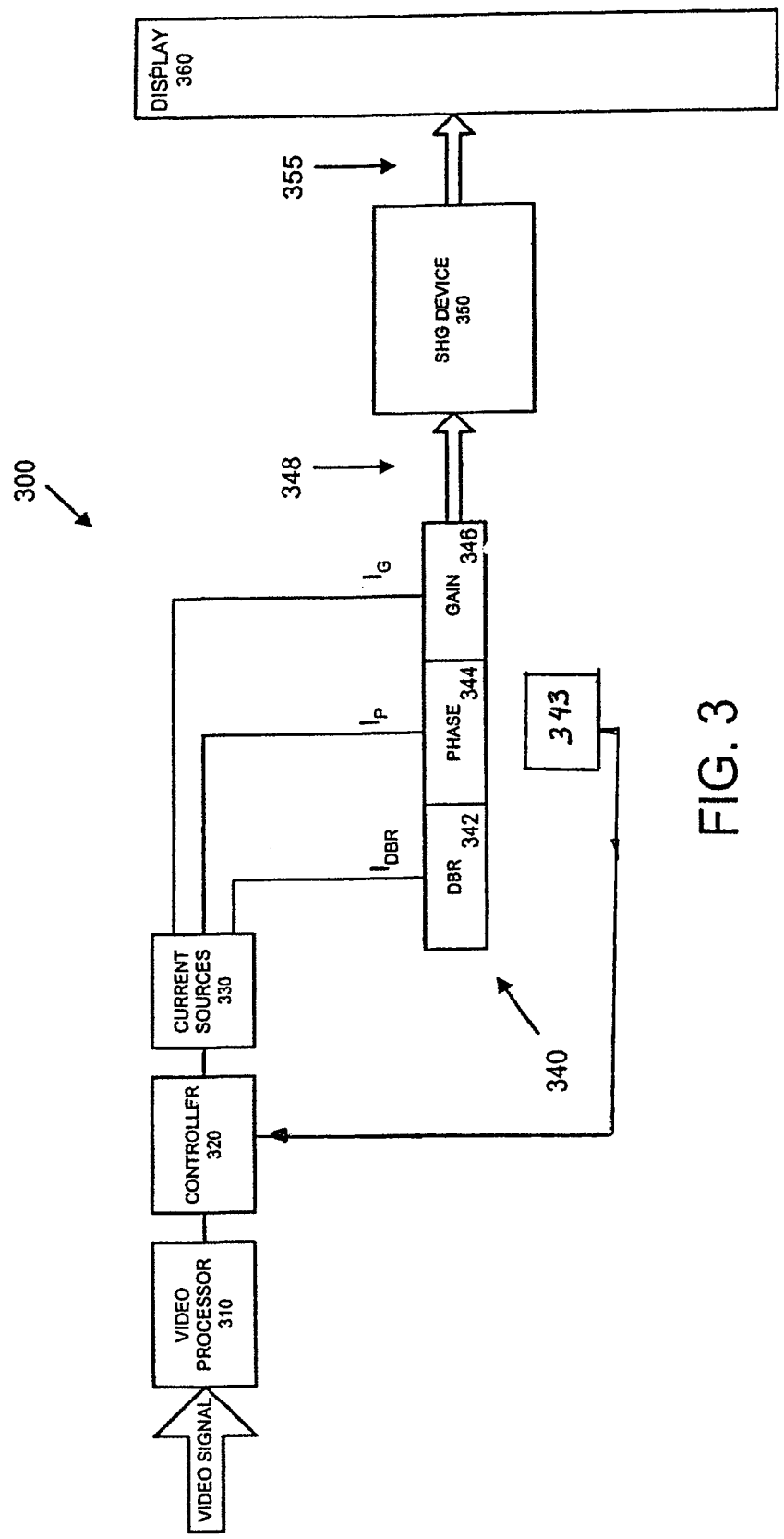
FIG. 3 illustrates an exemplary video display system employing the three-level current scheme of the present invention

In accordance with an exemplary embodiment of the present invention, a DBR semiconductor laser is a known semiconductor laser, for example, a 1060 nm DBR semiconductor laser, as shown generally in FIG. 3. A video processor 310 receives a video signal and sends the processed signal to a controller 320. The controller 320 controls current sources 330 which are applied to a DBR semiconductor laser 340. The DBR semiconductor laser 340 has three individual sections or portions: a DBR section or portion 342, a phase section or portion 344 and a gain section or portion 346. The lasing wavelength of output beam 348 generated by the DBR semiconductor laser 340 is tuned, by injecting a pulse-width modulated current into the DBR section 342, and fine-tuned, maintaining single spectral mode by injecting a pulse-width modulated current into the phase section 344, to the spectral center of a second harmonic generator (SHG) device 350. The SHG device 350 is used to half the wavelength (or double the frequency) output 348 from the DBR semiconductor laser 340 to 530 nm, thereby providing a low-cost, compact and efficient source for green light 355 for application in a display 360.

The wavelength modulation of the laser light output (IR light, for example) can be converted to the intensity modulation of the light (green light, for example) produced by the SHG device 350. The SHG device 350 has a very narrow bandwidth of 0.1 to 0.2 nm. Thus, if the current to the DBR section is changed to the "off" current, such a change would cause the wavelength light beam from the laser to be shifted out of the narrow bandwidth of the SHG device 350 (out of the center wavelength to another wavelength) and thus reduce or eliminate the intensity of the output beam of green light 355 from the SHG device 350. Alternatively, the SHG device 350 can also be set so that if the current is changed from the "off" current to the "on" current, and the laser output returns to the center wavelength, into the bandwidth of the SHG device 350 so as to increase or maximize the intensity of the output beam of green light 355 from the SHG device 350. One of ordinary skill would understand that, while only one DBR semiconductor laser is shown in the FIG. 3 embodiment, numerous DBR semiconductor lasers (for different wavelength outputs) could be employed and similarly controlled to provide an output for display.

Additionally while an SHG device 350 is discussed in accordance with exemplary embodiments, other types of wavelength-selective devices could be employed to provide an output. For example, passive optical filters could also be employed. Passive optical filters do not convert the wavelength of the output from a laser while providing a beam having a similar intensity.

In accordance with the present invention, the controller 320 employs a control scheme, to effectively control the injection currents $I_{DBR}$, $I_G$ and $I_P$ applied to the laser so that the beam generated by the laser has a wavelength shift unaffected by the thermal effect. The DBR-section current is modulated using a three-current system. The first current level corresponds to the "on" wavelength and two different "off" current levels correspond to two "off" wavelengths, one higher and one lower than the "on" wavelength. One of ordinary skill in the art would understand that the current is pulse-width modulated in order to produce pulsating currents at three levels. The gain currents are generally constant, as is known in the art. However, the phase current may also be pulse-width modulated similar to the modulation of the DBR-section current.

A temperature monitor 343 is used to keep track of the DBR section temperature and make decisions on when to change the current from one "off" current to the other "off" current. For the duration of each "on" wavelength, the thermal loading to the DBR section 342 of the DBR laser 340 is constant because there is only one constant current into the DBR section 342. For the duration of each "off" wavelength, the thermal loading to the DBR section 342 is nearly constant because the current into the DBR section 342 is switched between a higher and lower "off" value. When the laser wavelength needs to be switched away from the "on" wavelength, i.e., the SHG center wavelength, the "on" current is stopped and a lower "off" current is applied to the DBR section 342. The temperature monitor 343 measures temperature in real time. At a particular time that follows, if the laser wavelength needs to be switched to the SHG center wavelength, the "on" wavelength is applied. If the laser wavelength needs to continue to be away from the SHG center wavelength, then the temperature monitor 343 will compare the DBR temperature measured with a threshold temperature value, and if the DBR temperature is lower than the threshold value, then a higher "off" current is applied. The threshold temperature value is the DBR temperature at which, if the "on" current is applied, the lasing wavelength is away from the SHG center wavelength by a tolerable amount. However, if the DBR temperature is above the threshold temperature value, then the lower "off" current is still applied. Likewise, when the higher "off" current is applied, the temperature monitor is used to compare the measured DBR temperature to the threshold temperature value in order to decide when to change to the lower "off" current. Therefore, the current may be changed from the lower "off" current to the higher "off" current once per bit period or less frequently, depending upon the temperature change of the DBR temperature. Similarly, if the temperature is outside of the threshold temperature value, either above or below the threshold temperature value, for more than one bit period, the temperature monitor will indicate the lower "off" or higher "off" current only be used, respectively.

A temperature monitor 343 may also or instead measure the temperature of the phase section temperature and control the current for the phase section, making decisions similar to the current described above. If the phase section of the DBR laser 344 is used to fine-tune the wavelength of the DBR laser, then the phase section 344 may also contribute to the thermal loading of the laser and cause distortion in the wavelength. Therefore, the current injected into the phase section 344 may also be switched from an "on" wavelength to a lower "off" wavelength and then to a higher "off" wavelength, in order to keep the temperature of the laser constant. The thermal loading in the DBR section 342 and the phase section 344 can be kept constant by stepping the currents into each of the sections, keeping the temperature constant and the thermal loading constant. For simplicity, only thermal loading in the DBR section 342 of the laser is described below.

The temperature monitor may be a device that directly or indirectly measures the. DBR section temperature. For example, the temperature monitor may be a thermistor mounted on the DBR section 342 of the DBR laser 340 or a voltage meter that measures the temperature-dependent junction voltage, or other device. The temperature monitor may also be a software program that calculates the DBR section temperature according to the accumulated thermal loading during the previous bits. The thermal loading can be estimated by the product of the applied current and voltage value of DBR section.

FIGS. 4A, 4B, and 4C illustrate the wavelength and current for each "on" and "off" wavelength in accordance with the present invention. Each figure shows the relationship between the current applied to the DBR section 342 and the wavelength 348 produced by the DBR laser 340. The figures show the affect on wavelength of the three-level current scheme of the present invention.

As shown in FIG. 4A, a wavelength at the central wavelength for the SHG is induced by associated current $I_{DBR}$ injected into the DBR section 342 of the DBR semiconductor laser 340. The spectral graph shown in FIG. 4A illustrates the spectral density generated by the DBR semiconductor laser 340 during one bit period.

As shown in FIG. 4B, if one bit period needs to have an "on" wavelength for half of the bit period, a constant current is applied to the DBR section 342 for the first half of the bit period, and then a lower "off" current and a higher "off" current are applied. The two opposite "off" currents result in two lasing wavelengths that are away from the SHG center wavelength, i.e., the two lasing wavelengths are either longer or shorter than the SHG center wavelength. Also, the two opposite "off" currents have the same net thermal load as if a constant "on" current is applied. While not specifically shown, numerous other wavelengths can be generated using a similar three-level current scheme, based upon a required video signal intensity of the received video signal.

As shown in FIG. 4C, if one bit period needs to have an "off" wavelength for all of the bit period, a lower "off" current and a higher "off" current are applied. The two opposite "off" currents result in two lasing wavelengths that are either longer or shorter than the SHG center wavelength. The wavelength change due to the lower "off" current and the wavelength change due to the higher "off" current should be large enough in order to have nearly zero conversion efficiency with the SHG device 350. Alternating the two "off" currents ensures that the same net thermal load as a constant "on" current is applied.

The two "off" currents are asymmetric with respect to the "on" current. This is due to the efficiency of the carrier-induced wavelength change decreasing with current. In this case, the duration for the higher "off" current is shorter than the duration of the "lower" off current for the wavelength changes due to the two "off" currents to have the same effect.

FIGS. 5A, 5B, and 5C show the results of a test with the current modulation scheme of the present invention. FIGS. 5A and 5B show input current levels supplied to the DBR section 342 of a DBR laser 340. FIG. 5A shows a three-level current input, producing a partially on wavelength at the SHG center wavelength. The three currents are at 100 mA, 50 mA, and 155 mA. FIG. 5B shows an "off" wavelength, where the input current is switched between 50 mA and 155 mA.

FIG. 5C shows three curves, illustrating the frequency response of the DBR laser with the current inputs of FIGS. 5A and 5B. The top wavelength curve of FIG. 5C shows an "on" wavelength with a constant current input of 100 mA (current input not shown). The middle wavelength curve shows two "off" wavelengths on either side of the "on" wavelength, corresponding to each of the three input currents, one "on" and two "off" input currents. The bottom wavelength curve shows two "off" wavelengths, corresponding to the two input currents, a lower "off" current input and a higher "off" current input.

The embodiment illustrated in FIGS. 4A, 4B and 4C and FIGS. 5A, 5B and 5C considers adjusting the current of the DBR section 342 in order to keep the thermal loading of the DBR laser 340 constant within one bit period. The embodiment illustrates how to use two different currents into the DBR section 342, a lower "off" current and a higher "off" current, to switch the laser wavelength away from the SHG center wavelength. The lower thermal loading of the lower "off" current is compensated for by the higher "off" current, so that the overall thermal loading in one bit period is the same as if a constant "on" current is applied throughout that bit period. Therefore, the temperature of the DBR section 342 of the DBR laser 340 remains constant. The lasing wavelength produced when an "on" current is applied to the DBR section of the DBR laser 340 is aligned to the SHG center wavelength without a thermally-induced patterning effect. If the temperature changing speed of DBR laser is slower than each bit period of applications, the thermal loading can be kept constant over multiple bits.

Figure 6:
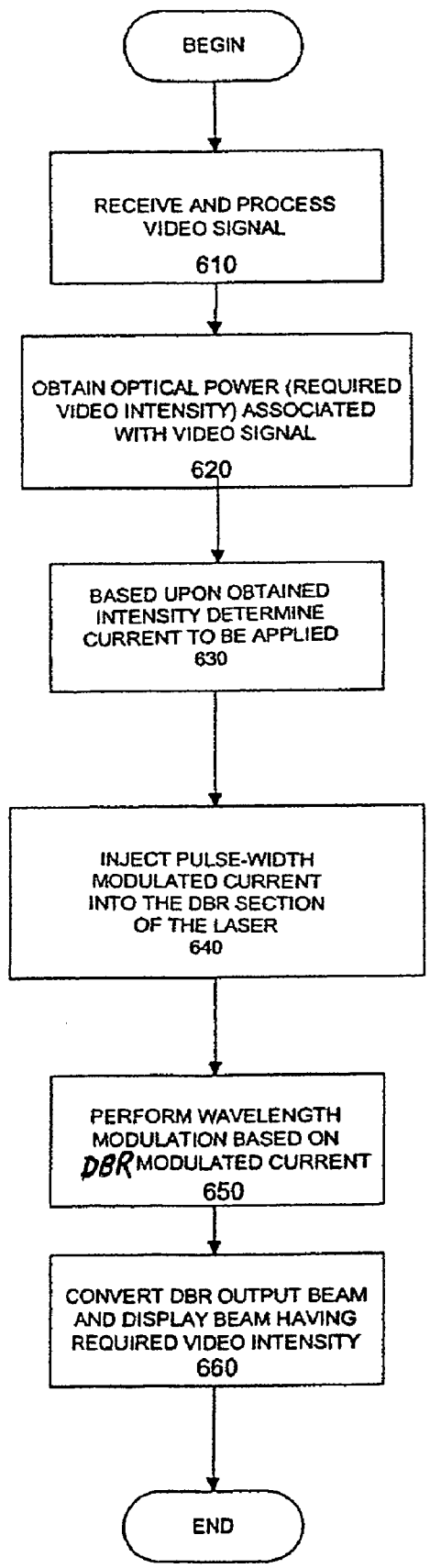
FIG. 6 illustrates a flow diagram providing a method of current modulation in accordance with the present invention.

Thus, in accordance with the present invention a method of modulating the DBR semiconductor laser wavelength output is provided in the flow diagram provided in FIG. 6. In step 610, the system (illustrated in FIG. 3) receives and processes the video signal. The required optical power (video intensity) associated with the video signal is obtained for a bit period in step 620. In step 630, the controller 320 receives the required optical power associated with the received video signal and determines an "on" current and "off" current percentage to be applied (as illustrated in FIG. 4B, for example).

In step 640, pulsed currents are injected into the DBR section of the DBR semiconductor laser having the determined "on" and "off" current values. If the bit period has an "on" current for 100% of the bit period, then a constant "on" current is applied. If the bit period has an "on" current for less than 100% but greater than 0% of the bit period, e.g., 50% of the bit period, then an "on" current is applied for half of the bit period and a lower "off" and/or higher "off" current are applied in the other half of the bit period. If the bit period has an "on" current for 0% of the bit period, then a lower "off" current and/or a higher "off" current are applied. Which "off" current should be used is determined by the history of the thermal loadings in previous bits to keep the temperature constant. In step 650, the DBR semiconductor laser generates a beam at modulated wavelength having an optical power based upon the required video intensity. In step 660, the beam is converted to a primary color (green for example) by the SHG device 350, and provides the required optical power to the display 360.

The present invention provides several distinct advantages over conventional systems. By employing the present invention, in the three-level current scheme, the net thermal loading of the DBR semiconductor laser is constant. By changing the "off" current from a lower "off" current to a higher "off" current when the temperature of the DBR section of the DBR laser moves outside of a threshold temperature value, as measured by a temperature monitor, rather than mechanically during each bit period, stringent requirements on the driving electronics and response time of the DBR laser are reduced.

While the present invention has been illustrated with a 3-section DBR semiconductor laser for use in video signal processing, other variation of DBR semiconductor lasers such as the sampled-grating DBR (SG-DBR) lasers and grating-assisted codirectional coupler with rear sampled-grating reflection (GCSR) lasers can also be employed.

It is, therefore, apparent that there has been provided, in accordance with the present invention, a method and system for current modulation. While this invention has been described in conjunction with a number of illustrative embodiments, it is evident that many alternatives, modifications, and variations would be or are apparent to those of ordinary skill in the applicable arts. Accordingly, the disclosure is intended to embrace all such alternatives, modifications, equivalents and variations that are within in the spirit and scope of this invention.

What is claimed is:

1. A method for modulating the wavelength of an output beam of a semiconductor laser, comprising the steps of:
    receiving a first current into a gain section of the laser, said gain current being essentially constant; and
    receiving a second, pulsating current which is pulse width modulated into a DBR section of the laser, said DBR section being modulated using at least a three-current system, said three currents being combinations of at least one of an "on" current that generates a center wavelength of said output beam, and alternating first and second "off" currents, wherein said first current "off" generates an output beam of a first "off" wavelength that longer than said central wavelength and second "off" current generates an output beam of a second "off" wavelength that is shorter than said central wavelength, said first and second "off" currents having lower and higher current amplitudes relative to a current amplitude of said "on" current, respectively,
    wherein combinations of first verses second "off" currents into said DBR section are selected such that current induced thermal loading of said laser remains sufficiently constant throughout operation of said DBR section to substantially avoid center wavelength drift of the center wavelength generated by the "on" current.

2. The method defined in claim 1, wherein levels of said combinations of an "on" current and first and second "off" currents are selected such that said thermal loading is substantially the same for each bit period.

3. The method defined in claim 1, wherein levels of said combinations of an "on" current and first and second "off" currents are selected such that thermal loading per bit period varies.

4. The method defined in claim 3, wherein only one or the other of said first and second "off" currents is used over multiple bit periods such that the temperature of said laser remains between selected temperature limits.

5. The method defined in claim 4, wherein a temperature of said semiconductor laser is determined, and the use of one or the other of said first and second "off" currents is periodically switched between to maintain said laser between said temperature limits.

6. The method defined in claim 4 wherein said temperature is sensed indirectly by an electronic component.

7. The method defined in claim 4, wherein said temperature is determined indirectly by a program of a digital processor that computes an accumulated thermal load from previous bit periods.

8. The method defined in claim 5, wherein only the first "off" current is used during operation if said determined temperature is below a selected temperature, and only the second "off" current is used if the determined temperature is above said selected temperature.

9. The method defined in claim 1, further including the step of directing said output beam into a second harmonics generation crystal to change the wavelength of said output beam.

10. A method for modulating the wavelength of an output beam of a semiconductor laser, comprising the steps of:
receiving a first current into a gain section of the laser; and
receiving a second pulsating current into a DBR section of the laser that is pulse-width modulated by combinations of an "on" current that generates a center wavelength of said output beam, and first and second alternating "off" currents that each generate a different wavelength of said output beam, said first and second "off" currents having higher and lower current amplitudes relative to a current amplitude of said "on" current generating said center wavelength,
wherein use of one or the other of said first and second "off" currents is alternated between over multiple bit periods such that current induced thermal loading of said laser remains sufficiently constant throughout operation of said laser to substantially avoid wavelength drift.

11. An apparatus for modulating the wavelength of an output beam of a semiconductor laser, comprising:
a first current source that supplies a first current to a gain section of the laser;
a second current source that supplies a second, pulsating current to a DBR section of the laser that is pulse width modulated by combinations of an "on" current that generates a center wavelength of said output beam and first and second alternating "off" currents that each generate a different wavelength output beam, said first and second "off" currents having higher and lower current amplitudes relative to the current amplitude of said "on" current, and
a control circuit for selecting one or the other of said first and second "off" currents during the operation of the laser, such that current induced thermal loading of the laser remains sufficiently constant to substantially avoid center wavelength drift of said output beam.

12. The modulating apparatus defined in claim 11, wherein said control circuit selects combinations of said "on" current and said first and second "off" currents such that thermal loading is substantially the same for each bit period.

13. The modulating apparatus defined in claim 11, wherein said control circuit alternates between selecting one or the other of said first and second "off" currents for multiple bit periods such that thermal loading remains substantially constant throughout the operation of said laser.

14. A method for modulating the wavelength of an output beam of a semiconductor laser, comprising the steps of:
receiving a first current into a gain section of the laser;
receiving a second current into a DBR section of the laser; and
receiving a third pulsating current into a phase section of the laser modulated by combinations of at least one of an "on" current that generates a center wavelength of said output beam, and first and second alternating "off" currents that each generate an output beam of a different wavelength than the center wavelength, said first and second "off" currents into phase section having higher and lower current amplitudes relative to a current amplitude of said "on" current, respectively,
wherein combinations of first verses second "off" currents are selected such that current induced thermal loading of said laser remains sufficiently constant throughout operation of said laser to substantially avoid center wavelength drift.

15. The method defined in claim 14, wherein said combinations of an "on" current and first and second "off" currents are selected such that said thermal loading is substantially the same for each bit period.

16. The method defined in claim 14, wherein said combinations of an "on" current and first and second "off" currents are selected such that thermal loading per bit period varies.

17. The method defined in claim 16, wherein only one or the other of said first and second "off" currents is used over multiple bit periods such that the temperature of said laser remains between selected temperature limits.

18. An apparatus for modulating the wavelength of an output beam of a semiconductor laser, comprising:
a first current source that supplies a first current to a gain section of the laser;
a second current source that supplies a second, current to a DBR section of the laser;
a third current source that supplies a third, pulsating current to a phase section of the laser that is pulse width modulated by combinations of an "on" current that generates a center wavelength of said output beam and first and second alternating "off" currents that each generate an output beam at a wavelength different from the center wavelength, said first and second "off" currents into said phase section having higher and lower current amplitudes relative to the current amplitude of said "on" current, and
a control circuit for selecting one or the other of said first and second "off" currents during the operation of the laser such that current induced thermal loading of the laser remains sufficiently constant to substantially avoid center wavelength drift of said output beam.

19. The modulating apparatus defined in claim 18, wherein said control circuit selects combinations of said "on" current and said first and second "off" currents such that thermal loading is substantially the same for each bit period.

20. The modulating apparatus defined in claim 18, wherein said control circuit alternates between selecting one or the other of said first and second "off" currents for multiple bit periods such that thermal loading remains substantially constant throughout the operation of said laser.

* * * * *